(12) United States Patent
Kang

(10) Patent No.: US 9,543,043 B2
(45) Date of Patent: Jan. 10, 2017

(54) METHOD FOR TESTING ARRAY FUSE OF SEMICONDUCTOR APPARATUS

(71) Applicant: SK hynix Inc., Icheon-si Gyeonggi-do (KR)

(72) Inventor: Jae Seok Kang, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 59 days.

(21) Appl. No.: 14/514,477

(22) Filed: Oct. 15, 2014

(65) Prior Publication Data

US 2016/0012917 A1    Jan. 14, 2016

(30) Foreign Application Priority Data

Jul. 8, 2014   (KR) .................. 10-2014-0085216

(51) Int. Cl.

| G11C 29/38 | (2006.01) |
|---|---|
| G11C 29/44 | (2006.01) |
| G11C 29/04 | (2006.01) |
| G11C 29/02 | (2006.01) |
| G11C 29/56 | (2006.01) |
| G11C 29/00 | (2006.01) |

(52) U.S. Cl.
CPC .......... *G11C 29/44* (2013.01); *G11C 29/027* (2013.01); *G11C 29/56008* (2013.01); *G11C 29/787* (2013.01)

(58) Field of Classification Search
CPC . G11C 29/38; G11C 29/44; G11C 2029/0409; G11C 29/56008; G01R 31/31704; G01R 31/3185; G06F 11/2289; G06F 11/267
See application file for complete search history.

(56) References Cited

U.S. PATENT DOCUMENTS

| 5,659,551 | A | * | 8/1997 | Huott | ............... | G01R 31/31838 |
|---|---|---|---|---|---|---|
| | | | | | | 714/53 |
| 5,805,789 | A | * | 9/1998 | Huott | ................. | G06F 11/2294 |
| | | | | | | 714/6.32 |
| 6,310,807 | B1 | * | 10/2001 | Ooishi | ................... | G11C 29/44 |
| | | | | | | 365/200 |
| 6,327,556 | B1 | * | 12/2001 | Geiger | ............ | G01R 31/31704 |
| | | | | | | 702/117 |
| 7,137,055 | B2 | * | 11/2006 | Hirano | ............ | G01R 31/31935 |
| | | | | | | 714/718 |

(Continued)

FOREIGN PATENT DOCUMENTS

KR            10488582 B1    5/2005

*Primary Examiner* — Phung M Chung
(74) *Attorney, Agent, or Firm* — William Park & Associates Ltd.

(57) ABSTRACT

A method for testing an array fuse block of a semiconductor apparatus may include a series of operations for testing an array fuse block of the semiconductor apparatus as a test program is executed. The series operations may include the following steps: generating a test source file containing information for accessing the array fuse block; generating a test vector using the test source file; extracting repair confirmation information by performing a simulation using the test vector; extracting a repair confirmation information expected value from the test source file; and determining a pass or fail by comparing the repair confirmation information to the repair confirmation information expected value.

15 Claims, 4 Drawing Sheets

(56) References Cited

U.S. PATENT DOCUMENTS

| | | | | |
|---|---|---|---|---|
| 7,411,845 B2* | 8/2008 | Kodama | ............... | G11C 29/02 |
| | | | | 365/189.07 |
| 7,573,762 B2* | 8/2009 | Kenkare | ............... | G11C 17/18 |
| | | | | 365/200 |
| 8,315,117 B2* | 11/2012 | Zhang | ................... | G11O 5/147 |
| | | | | 365/200 |
| 8,582,377 B2* | 11/2013 | Fujiwara | .................. | G11C 8/12 |
| | | | | 365/189.09 |
| 2004/0193979 A1* | 9/2004 | Avery | .............. | G01R 31/31926 |
| | | | | 714/724 |
| 2014/0169059 A1* | 6/2014 | Kong | ................... | G11C 29/785 |
| | | | | 365/96 |

* cited by examiner

FIG.2

MRD File

```
Test Vector 165    wt     0    0000   ----0--------f--------0--------3---   ----- -
166    nop    -           ----  ----0--------f--------0--------3---   ----- -
167    wt     0    0000   ----0--------c--------0--------c---   ----- -
168    nop    -           ----  ----0--------3--------0--------0---   ----- -
169    nop    -           ----  -------------------------------------   ----- -
170    nop    -           ----  -------------------------------------   ----- -
171    nop    -           ----  -------------------------------------   ----- -
172    nop    -           ----  -------------------------------------   ----- -
173    nop    -           ----  -------------------------------------   ----- -
174    nop    -           ----  -------------------------------------   ----- -
175    nop    -           ----  -------------------------------------   ----- -
176    nop    -           ----  -------------------------------------   ----- -
177    nop    -           ----  -------------------------------------   ----- -
178    nop    -           ----  -------------------------------------   ----- -
179    nop    -           ----  -------------------------------------   ----- -
180    nop    -           ----  -------------------------------------   ----- -
181    nop    -           ----  -------------------------------------   ----- -
182    BSTP   -           ----  -------------------------------------   ----- -
183    nop    -           ----  -------------------------------------   ----- -
184    BSTP   -           ----  -------------------------------------   ----- -
185    nop    -           ----  -------------------------------------   ----- -
186    BSTP   -           ----  -------------------------------------   ----- -
187    nop    -           ----  -------------------------------------   ----- -
```

METHOD FOR TESTING ARRAY FUSE OF SEMICONDUCTOR APPARATUS

CROSS-REFERENCES TO RELATED APPLICATION

The present application claims priority under 35 U.S.C. §119(a) to Korean application number 10-2014-0085216, filed on Jul. 8, 2014, in the Korean Intellectual Property Office, which is incorporated herein by reference in its entirety.

BACKGROUND

1. Technical Field

Various embodiments generally relate to a semiconductor apparatus, and more particularly, to a method for testing an array fuse of a semiconductor apparatus.

2. Related Art

A semiconductor apparatus may include a memory block. The memory block may include a plurality of memory cells.

A part of the plurality of memory cells may serve as redundant memory cells (hereafter, referred to as redundant cells) for replacing memory cells having a defect (hereafter, defective cells).

Through testing, a defective cell may be detected among the plurality of memory cells.

An operation of replacing the detected defective cell with a redundant cell, that is, an operation of replacing an address for accessing the defective cell with an address corresponding to the redundant cell replacing the defective cell may be referred to as a repair operation. The address for accessing the defective cell may be referred to as a repair address.

The semiconductor apparatus may include an array fuse block for storing repair addresses.

However, in real world situations, it may be difficult to access all unit fuses of the array fuse block so as to check whether repair operations are normally performed. As a result, this makes it difficult to secure the operation reliability of the semiconductor apparatus.

SUMMARY

In an embodiment, there may be provided a method for testing an array fuse of a semiconductor apparatus. The method may perform a series of operations for testing an array fuse block of the semiconductor apparatus as a test program is executed. The series operations may include the following steps: generating a test source file containing information for accessing the array fuse block; generating a test vector using the test source file; extracting repair confirmation information by performing a simulation using the test vector; extracting a repair confirmation information expected value from the test source file; and determining a pass or fail by comparing the repair confirmation information to the repair confirmation information expected value.

A delay time from the time at which the test program is executed to the step of extracting the repair confirmation information may be set to be equal to a delay time from the time at which the test program is executed to the step of extracting the repair confirmation information expected value.

The simulation may include: performing a boot-up operation according to the test vector; performing a rupture operation of writing repair addresses to unit fuses which are sequentially designated by the test vector, in the array fuse block; and performing reboot-up and normal active operations, after the rupture operation.

In the step of determining the pass or fail, when the repair confirmation information expected value has a first logic level at a timing at which the repair confirmation information is at the first logic level, the result may be determined as a pass.

BRIEF DESCRIPTION OF THE DRAWINGS

FIG. 2 is a diagram illustrating a representation of the configuration of a MRD file of FIG. 1.

FIG. 3 is a diagram illustrating a representation of the configuration of a test vector of FIG. 1.

DETAILED DESCRIPTION

Hereinafter, various examples of embodiments will be described below with reference to the accompanying drawings through various embodiments.

The embodiments may provide methods for automatically testing an access to an array fuse block and whether a repair operation is normally performed.

Also, various embodiments may be directed to a method for testing an array fuse of a semiconductor apparatus, which is capable of automatically accessing all unit fuses of the array fuse so as to verify whether repair operations are normally performed.

Similar to a memory block, an array fuse block may include a plurality of unit fuses arranged in a matrix shape and word lines and bit lines coupled to the plurality of unit fuses.

An electronic fuse may be used, for example, as the unit fuse forming the array fuse block. The electronic fuse may change the electric state thereof through ruptures caused by accessing and storing a logic value. This may occur even after packaging occurs.

Figure 1:
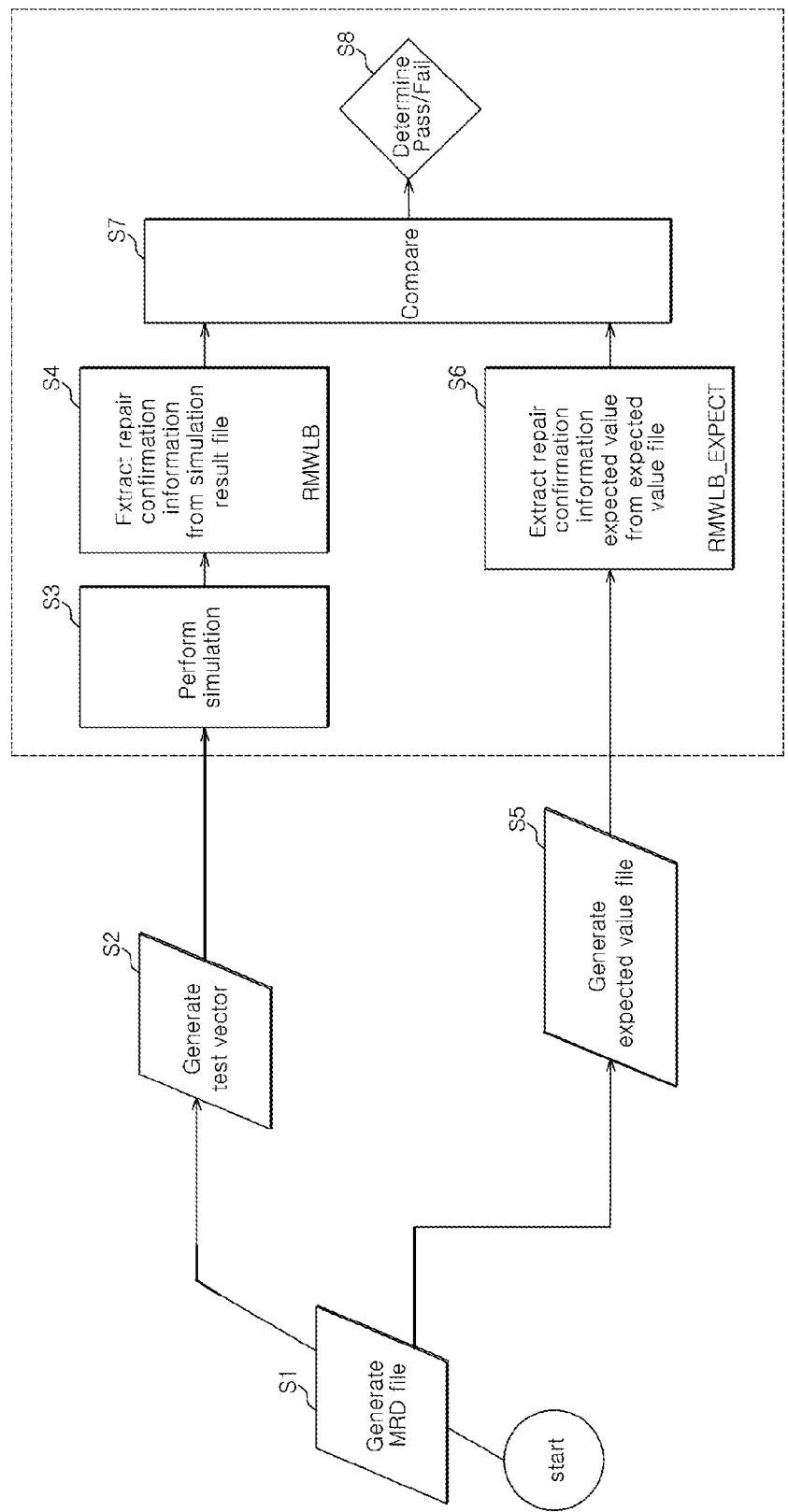
FIG. 1 is a representation of a diagram for explaining a method for testing an array fuse of a semiconductor apparatus according to an embodiment.

When a test program of software begins, as illustrated in FIG. 1, a series of operations for testing an array fuse block may be performed as follows.

First, a test source file containing information for accessing all unit fuses of the array fuse block, that is, a MRD (Memory Repair Data) file may be generated at step S1.

The unit fuse may be accessed in the same manner or substantially the same manner as a memory cell. That is, the unit fuse may be accessed through a selective combination of a word line WL and a bit line BL of the array fuse block.

The MRD file may include information for accessing and rupturing all unit fuses.

Access to the unit fuse of the array fuse block may be performed through an input/output pad DQ of the semiconductor apparatus.

Figure 2:
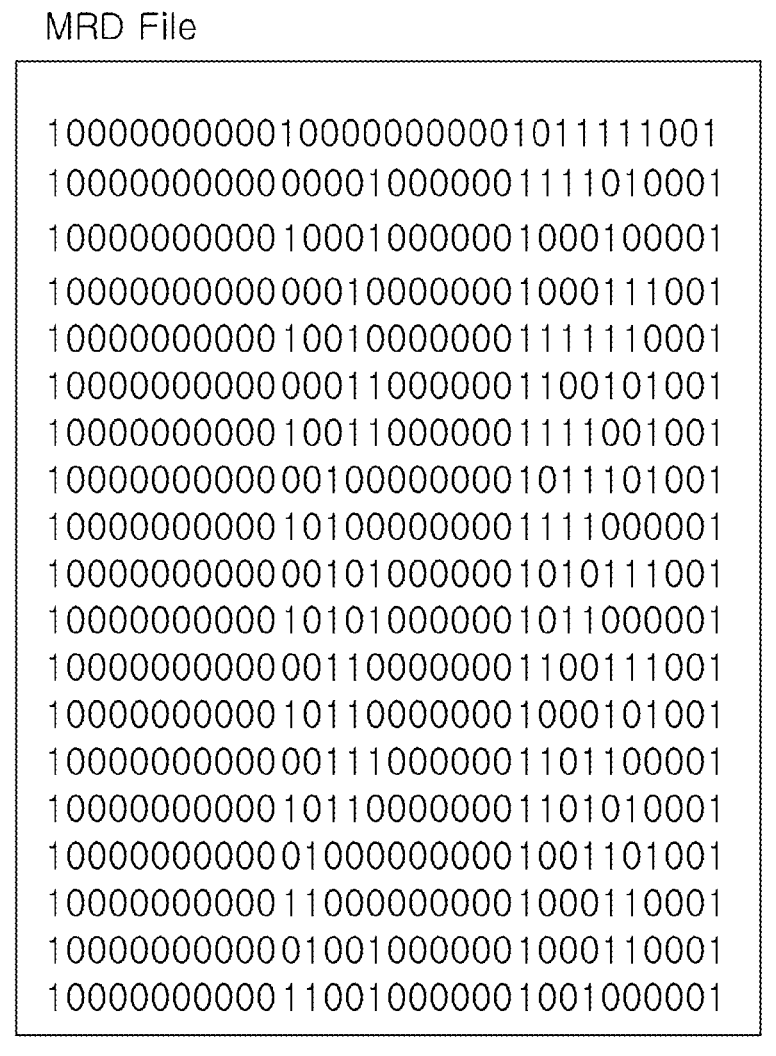

Referring to FIG. 2, the MRD file may include, for example but not limited to, 32-bit information for accessing array fuses corresponding to BL8 (Burst Length=8) for four input/output pads DQ.

The MRD file may be used to generate a test vector at step S2.

The test vector may be constructed in such a manner as illustrated in FIG. 3. The test vector may have a pattern of sequentially performing boot-up, rupture, reboot-up, and normal active operations in the direction of row for each of the unit fuses of the array fuse block.

Rupture information, that is, information required for a rupture operation may include a row address (hereafter, fuse row address) for selecting a word line WL of the array fuse block, a column address (hereafter, fuse column address) for selecting a bit line BL of the array fuse block, and a repair address to be stored in the array fuse block.

The rupture information may be acquired, for example, from the MRD file.

The fuse row address and the fuse column address of the rupture information may be sequentially generated, and the repair address may be randomly generated.

The test vector may be used to perform an array fuse simulation at step S3.

The simulation may be performed by inputting the test vector to a netlist obtained by implementing the semiconductor apparatus in software through, for example, Verilog, etc.

At this time, the test vector may be inputted through an input/output pad DQ implemented on the netlist.

The netlist may perform a boot-up operation according to the test vector, and then perform a rupture operation of writing a repair address to a unit fuse corresponding to a fuse row address and a fuse column address which are acquired from the MRD file.

The netlist may generate a simulation result file through reboot-up and normal active operations after the rupture operation, and extract repair confirmation information from the simulation result file at step S4.

At this time, the simulation may be performed to determine whether the array fuse block is normally operated, that is, whether the repair operation is normally performed.

Thus, as the repair confirmation information of the simulation result file, the value of a redundant word line select signal RMWLB may be used.

A normal address provided during the normal active operation may have the same value as a repair address previously stored in the array fuse block during the rupture process.

Thus, the netlist may perform a repair operation during the normal active operation after the reboot-up operation, that is, an operation of repairing a normal word line corresponding to the input normal address into a redundant word line corresponding to a redundant address.

Through the repair operation, the repair confirmation information of the netlist may be activated at a predetermined timing.

While the repair confirmation information is extracted through the above-described steps S2 to S4, a simulation expected value file may be generated from the MRD file at step S5, and a repair confirmation information expected value may be extracted from the expected value file at step S6.

At this time, the value of a redundant word line select signal RMWLB_EXPECT may be used as the repair confirmation information expected value.

The repair confirmation information of the step S4 and the repair confirmation information expected value of the step S6 may be compared at a predetermined timing at step S7.

According to whether the repair confirmation information and the repair confirmation information expected value coincide with each other, a pass or fail may be determined at step S8.

As described above, the netlist may be obtained by implementing a semiconductor circuit in software. A delay time D1 from the step S2 of generating the test vector to the step S4 of extracting the repair confirmation information may be predefined.

Furthermore, a delay time D2 from the step S5 of generating the expected value file on the test program to the step S6 of extracting the repair confirmation information expected value may be set to equal to the delay time D1.

Thus, at the step S8 of determining a pass or fail, the case in which the redundant word line select signal RMWLB_EXPECT corresponding to the repair confirmation information expected value is logic low at a timing at which the redundant word line select signal RMWLB corresponding to the repair confirmation information is logic low may be determined as a pass.

Through the above-described process, an arbitrary unit fuse of the array fuse block may be tested.

Then, the fuse row address and the fuse column address of the rupture information may be sequentially changed, and the above-described steps S2 to S8 may be repeated to sequentially select other unit fuses by randomly changing the address values. Then, the test may be completed.

Figure 4:
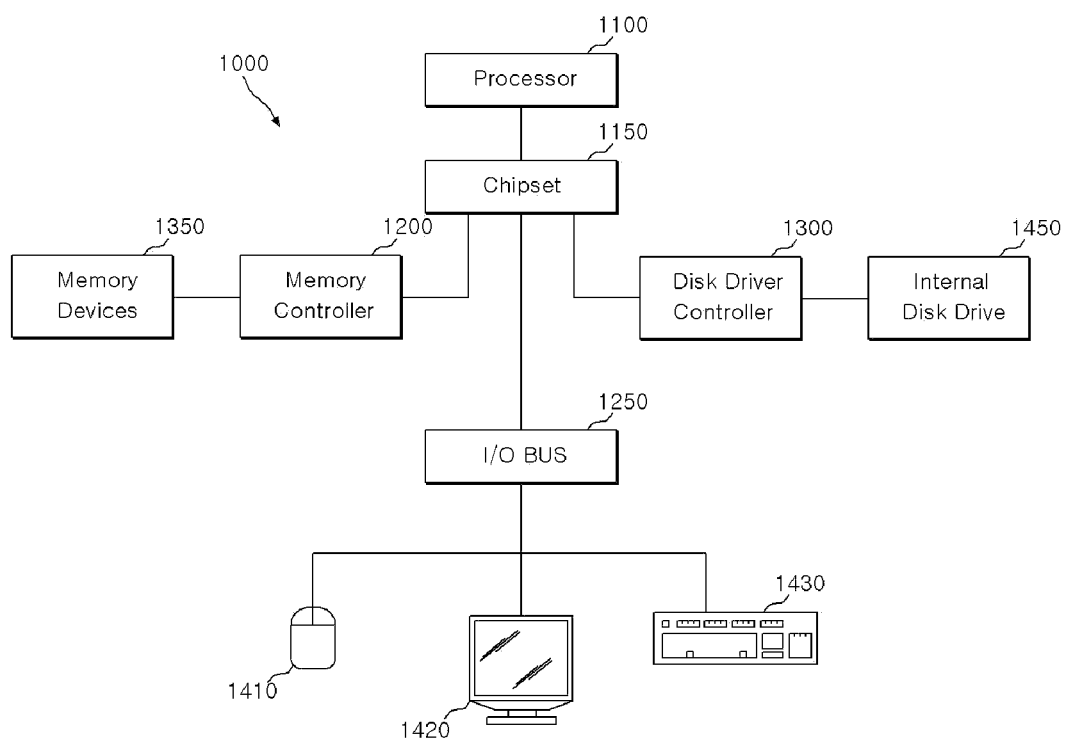
FIG. 4 illustrates a block diagram of an example of a representation of a system employing the methods and semiconductor apparatuses in accordance with the embodiments discussed above with relation to FIGS. 1-3.

The methods and semiconductor apparatuses discussed above (see FIGS. 1-3) are particular useful in the design of memory devices, processors, and computer systems. For example, referring to FIG. 4, a block diagram of a system employing the methods and semiconductor apparatuses in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-3. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-3, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 4 is merely one example of a system employing the semiconductor apparatus as discussed above with relation to FIGS. 1-4. In alternate embodiments, such as cellular phones or digital cameras, the components may differ from the embodiments illustrated in FIG. 4.

While various embodiments have been described above, it will be understood to those skilled in the art that the embodiments described are by way of example only. Accordingly, the semiconductor apparatus described herein should not be limited based on the described embodiments.

What is claimed is:

1. A method for testing a non-transitory array fuse block of a semiconductor apparatus, wherein the non-transitory array fuse block of the semiconductor apparatus storing a test program, and when executed by a processor, causes the processor to perform method steps comprising:
   starting the test program;
   generating a test source file containing information for accessing all unit fuses of the non-transitory array fuse block;
   generating a test vector using the test source file, wherein the test vector comprises a pattern of sequentially performing boot-up, rupture, reboot-up, and normal active operations for each of unit fuses of the non-transitory array fuse block;
   extracting a repair confirmation information by performing a simulation using the test vector;
   extracting a repair confirmation information expected value from the test source file; and
   determining a pass or fail by comparing the repair confirmation information to the repair confirmation information expected value.

2. The method according to claim 1, wherein the test source file comprises information for accessing all unit fuses of the non-transitory array fuse block.

3. The method according to claim 2, wherein the unit fuses are arranged in a matrix shape.

4. The method according to claim 2, wherein the test source file includes information for accessing and rupturing all unit fuses.

5. The method according to claim 2,
   wherein the unit fuses of the non-transitory array fuse block are accessed through input/output pads of the semiconductor apparatus, and
   wherein the test source file includes a file including 32-bit information for accessing the non-transitory array fuses corresponding to a burst length equal to eight for four input/output pads.

6. The method according to claim 1, wherein information required for the rupture operation comprises a row address for selecting a word line of the non-transitory array fuse block, a column address for selecting a bit line, and a repair address to be stored in the non-transitory array fuse block.

7. The method according to claim 6, wherein the row address and the column address are sequentially generated.

8. The method according to claim 6, wherein the repair address is randomly generated.

9. The method according to claim 1, wherein a delay time from the step of the starting test program to the step of extracting the repair confirmation information is set to be equal to a delay time from the step of the starting test program to the step of extracting the repair confirmation information expected value.

10. The method according to claim 1, wherein the step of extracting the repair confirmation information comprises:
    inputting the test vector to a netlist obtained by implementing the semiconductor apparatus in software;
    performing, by the netlist, a simulation according to the test vector and generating a simulation result file; and
    extracting the repair confirmation information from the simulation result file.

11. The method according to claim 10, wherein the simulation comprises:
    performing a boot-up operation according to the test vector;
    performing a rupture operation of writing repair addresses to unit fuses which are sequentially designated by the test vector, in the array fuse block; and
    performing reboot-up and normal active operations, after the rupture operation.

12. The method according to claim 1, wherein the step of extracting the repair confirmation information expected value comprises:
    generating an expected value file from the test source file; and
    extracting the repair confirmation information expected value from the expected value file.

13. The method according to claim 1, wherein the value of a redundant word line select signal is used as the repair confirmation information.

14. The method according to claim 1, wherein the value of a redundant word line select signal is used as the repair confirmation information expected value.

15. The method according to claim 1, wherein in the step of determining the pass or fail,
    when the repair confirmation information expected value has a first logic level at a timing at which the repair confirmation information is at the first logic level, the result is determined as a pass.

\* \* \* \* \*